US009847265B2

(12) United States Patent
Donner et al.

(10) Patent No.: US 9,847,265 B2
(45) Date of Patent: Dec. 19, 2017

(54) FLOW METERING FOR DISPENSE MONITORING AND CONTROL

(71) Applicant: Nordson Corporation, Westlake, OH (US)

(72) Inventors: Joseph E. Donner, San Marcos, CA (US); Michael Gorman, Oceanside, CA (US); Christopher L. Giusti, San Marcos, CA (US); Alan R. Lewis, Carlsbad, CA (US); Horatio Quinones, San Marcos, CA (US); Thomas L. Ratledge, San Marcos, CA (US); Yuriy Suhinin, San Diego, CA (US)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 14/855,487

(22) Filed: Sep. 16, 2015

(65) Prior Publication Data

US 2016/0005668 A1 Jan. 7, 2016

Related U.S. Application Data

(63) Continuation-in-part of application No. 14/062,345, filed on Oct. 24, 2013, now Pat. No. 9,393,586, which
(Continued)

(51) Int. Cl.
*H01L 21/66* (2006.01)
*G01F 1/00* (2006.01)
(Continued)

(52) U.S. Cl.
CPC .............. *H01L 22/26* (2013.01); *B05B 15/02* (2013.01); *B05C 5/0225* (2013.01);
(Continued)

(58) Field of Classification Search
CPC ... H01L 22/26; H01L 21/563; B05C 11/1013; B05C 5/0225; B05C 11/1034; B05B 15/02; G01F 1/00; G01G 17/06
(Continued)

(56) References Cited

U.S. PATENT DOCUMENTS 1,599,081 A  9/1926 Douglas
4,090,262 A  5/1978 Schneider et al.
(Continued)

FOREIGN PATENT DOCUMENTS

CN  1660507 A  8/2005
CN  101472834 A  7/2009
(Continued)

OTHER PUBLICATIONS

Chinese Application No. 201380060859.5: First Office Action with Search Report dated Aug. 15, 2016, 16 pages.
(Continued)

*Primary Examiner* — Donnell Long
(74) *Attorney, Agent, or Firm* — Baker & Hostetler LLP

(57) ABSTRACT

Methods and systems of accurately dispensing a viscous fluid onto a substrate. In an embodiment, a method includes using an electronic flow meter device to produce electrical flow meter output signals and performing a responsive control function in a closed loop manner by adjusting at least one dispensing parameter to correct for a difference between an output data set and a reference data set. In another embodiment, a system includes a control operatively coupled to a gas flow meter device and to a weigh scale allowing for a density of an amount of viscous material to be determined. In another embodiment, a method includes using a control coupled to both a gas flow meter device and a weigh scale and performing a responsive control function in a closed loop manner by adjusting at least one dispensing
(Continued)

parameter using gas flow meter output signals and weigh scale output signals.

12 Claims, 5 Drawing Sheets

Related U.S. Application Data is a continuation of application No. 13/753,038, filed on Jan. 29, 2013, now abandoned.

(60) Provisional application No. 61/728,886, filed on Nov. 21, 2012.

(51) Int. Cl.
| | | |
|---|---|---|
| *G01G 17/06* | (2006.01) | |
| *H01L 21/56* | (2006.01) | |
| *B05B 15/02* | (2006.01) | |
| *B05C 5/02* | (2006.01) | |
| *B05C 11/10* | (2006.01) | |

(52) U.S. Cl.
CPC .......... *B05C 11/1013* (2013.01); *G01F 1/00* (2013.01); *G01G 17/06* (2013.01); *H01L 21/563* (2013.01); *B05C 11/1034* (2013.01)

(58) Field of Classification Search
USPC .......................................................... 222/55
See application file for complete search history.

(56) References Cited

U.S. PATENT DOCUMENTS

| | | | |
|---|---|---|---|
| 4,430,886 A | 2/1984 | Rood | |
| 4,629,164 A | 12/1986 | Sommerville | |
| 5,188,258 A | 2/1993 | Iwashita | |
| 5,481,260 A | 1/1996 | Buckler et al. | |
| 5,857,589 A * | 1/1999 | Cline ................ | B01F 5/0615 222/1 |
| 6,173,864 B1 | 1/2001 | Reighard et al. | |
| 6,541,304 B1 | 4/2003 | Bouras et al. | |
| 6,579,563 B1 | 6/2003 | Dillon | |
| 6,692,572 B1 | 2/2004 | Allen | |
| 6,716,478 B2 | 4/2004 | Kitano et al. | |
| 7,296,706 B2 | 11/2007 | Raterman et al. | |
| 7,939,125 B2 | 5/2011 | Abernathy et al. | |
| 7,967,168 B2 | 6/2011 | Geier et al. | |
| 8,136,477 B2 | 3/2012 | Cho | |
| 8,257,779 B2 | 9/2012 | Abernathy et al. | |
| 8,424,720 B2 | 4/2013 | Tracy et al. | |
| 8,545,929 B2 | 10/2013 | Espenschied et al. | |
| 2001/0015222 A1 | 8/2001 | Lewit et al. | |
| 2002/0014496 A1 | 2/2002 | Cline et al. | |
| 2002/0060226 A1 | 5/2002 | Kameyama | |
| 2003/0041903 A1 | 3/2003 | Chang et al. | |
| 2005/0048195 A1 | 3/2005 | Yanagita | |
| 2006/0273120 A1 | 12/2006 | Staten | |
| 2007/0062642 A1 | 3/2007 | Reck et al. | |
| 2008/0000421 A1 | 1/2008 | Ooshima et al. | |
| 2008/0006650 A1 | 1/2008 | Tseng et al. | |
| 2008/0107796 A1 | 5/2008 | Cho | |
| 2008/0210706 A1 | 9/2008 | Geier et al. | |
| 2008/0283550 A1 | 11/2008 | Nighy et al. | |
| 2009/0104343 A1 | 4/2009 | Espenschied et al. | |
| 2009/0140007 A1 | 6/2009 | Voss | |
| 2010/0058985 A1 | 3/2010 | Kim et al. | |
| 2010/0212814 A1 | 8/2010 | Yamamoto | |
| 2010/0260531 A1 | 10/2010 | Rademacher | |
| 2010/0310765 A1 | 12/2010 | Olsson et al. | |
| 2012/0085282 A1 | 4/2012 | Ikagawa et al. | |
| 2012/0095588 A1 | 4/2012 | Barkmann et al. | |
| 2012/0104033 A1 | 5/2012 | MacIndoe | |
| 2012/0132672 A1 | 5/2012 | Van Dinter | |
| 2012/0175386 A1 | 7/2012 | Tracy et al. | |
| 2012/0211518 A1 | 8/2012 | Freidin | |
| 2012/0325864 A1 | 12/2012 | Imaizumi et al. | |
| 2014/0135972 A1 | 5/2014 | Galeb | |
| 2014/0138400 A1 | 5/2014 | Donner et al. | |

FOREIGN PATENT DOCUMENTS

| | | | |
|---|---|---|---|
| EP | 0499714 A1 | 8/1992 | |
| JP | 2000-126664 A | 5/2000 | |
| JP | 2001-121062 A | 5/2001 | |
| JP | 2007-503982 A | 3/2007 | |
| JP | 2008-542146 A | 11/2008 | |
| JP | 2009-542430 A | 12/2009 | |
| WO | 89/03104 A1 | 4/1989 | |
| WO | 9713586 A1 | 4/1997 | |
| WO | 2008002825 A1 | 1/2008 | |

OTHER PUBLICATIONS

International Patent Application No. PCT/US2016/051468: International Search Report and the Written Opinion dated Nov. 21, 2016.

European Patent Office, International Search Report and Written Opinion in PCT Application No. PCT/US2013/067169, dated Mar. 4, 2014.

The International Bureau of WIPO, International Preliminary Report on Patentability in PCT Application No. PCT/US2013/067169, dated Jun. 4, 2015.

English Translation of JP Office Action dated Aug. 31, 2017 for JP Application No. 2015544073.

* cited by examiner

FLOW METERING FOR DISPENSE MONITORING AND CONTROL

CROSS-REFERENCE TO RELATED APPLICATIONS

This application is a continuation-in-part of application Ser. No. 14/062,345, filed Oct. 24, 2013 (pending), which is a continuation of application Ser. No. 13/753,038, filed Jan. 29, 2013 (abandoned) which claims the priority of Application Ser. No. 61/728,886, filed Nov. 21, 2012 (expired), the disclosures of which are hereby incorporated by reference herein.

TECHNICAL FIELD

The present invention relates generally to the field of fluid dispensers that accurately dispense small amounts of viscous fluids in various forms such as dots or droplets, or lines.

BACKGROUND

In the manufacture of various items, such as printed circuit ("PC") boards, it is frequently necessary to apply small amounts of viscous fluid materials, i.e. those with a viscosity greater than fifty centipoise, to substrates. Such materials include, by way of example and not by limitation, general purpose adhesives, solder paste, solder flux, solder mask, grease, oil, encapsulants, potting compounds, epoxies, die attach pastes, silicones, RTV and cyanoacrylates.

As one example, a fabrication process known as flip chip technology has developed, which has multiple processes that require viscous fluid dispensing. For example, a semiconductor die or flip chip is first attached to a PC board via solder balls or pads, and in this process, a viscous solder flux is applied between the flip chip and the PC board. Next, a viscous liquid epoxy is dispensed and allowed to flow and completely cover the underside of the chip. This underfill operation requires that a precise amount of the liquid epoxy be deposited along at least one side edge of the semiconductor chip. As the volume of the epoxy decreases during the curing process, a pseudo-hydrostatic state of stress will be imposed on the solder balls or pads, and this will provide resistance to deformation of the solder balls or pads, and therefore resistance to fracture. The liquid epoxy flows under the chip as a result of capillary action due to the small gap between the underside of the chip and the upper surface of the PC board. Once the underfill operation is complete, it is desirable that enough liquid epoxy be deposited to encapsulate all of the electrical interconnections, so that a fillet is formed along the side edges of the chip. A properly formed fillet ensures that enough epoxy has been deposited to provide maximum mechanical strength of the bond between the chip and the PC board. It is critical to the quality of the underfilling process that the exact amount of epoxy is deposited at exactly the right location. Too little epoxy can result in corrosion and excessive thermal stresses. Too much epoxy can flow beyond the underside of the chip and interfere with other semiconductor devices and interconnections. These parameters must be accurately controlled in the context of manufacturing environments that require high speed productivity.

In another application, a chip is bonded to a PC board. In this application, a pattern of adhesive is deposited on the PC board; and the chip is placed over the adhesive with a downward pressure. The adhesive pattern is designed so that the adhesive flows evenly between the bottom of the chip and the PC board and does not flow out from beneath the chip. Again, in this application, it is important that a precise amount of adhesive be deposited at exact locations on the PC board.

The PC board is often being carried by a conveyor past a viscous material dispenser that is mounted for two axes of motion above the PC board. The moving dispenser is often of the type capable of depositing small dots or droplets of viscous material at desired locations on the PC board. This type of dispenser is commonly referred to as a non-contact jetting dispenser. There are several variables that are often controlled in order to provide a high quality viscous material dispensing process. First, the weight or size of each of the dots is controlled. Known viscous material dispensers have closed loop controls that are designed to hold the dot size constant during the material dispensing process. It is known to control the dispensed weight or dot size by varying the supply pressure of the viscous material, the on-time of a dispensing valve within the dispenser and the stroke length of a valve member of the jetting dispenser. Known control loops have advantages and disadvantages depending on the design of a particular dispenser and the viscous material being dispensed. However, known techniques often require additional components and mechanical structure, such as weigh scales, thereby introducing additional cost, time and reliability issues. Further, known methods often involve the use of calibration procedures, separate from the manufacturing process, which reduces productivity. Therefore, there is a continuing need to provide faster and simpler means for controlling parameters such as dot size, and dispensed fluid volume or weight.

Another important variable that may be controlled in the dispensing process is the total amount of viscous material to be dispensed in a particular cycle. Often the designer of a chip specifies the total amount of viscous material, for example, epoxy in underfilling, or adhesive in bonding, that is to be used in order to provide a desired underfilling or bonding process. In jetting, for example, for a given dot size and dispenser speed, it is known to program a dispenser control so that the dispenser dispenses a proper number of dots to dispense a specified amount of the viscous material in a desired line or pattern at the desired location. Such a system is reasonably effective when the dispensing parameters remain constant. However, such parameters are constantly changing, albeit, often only slightly over the short term. The cumulative effect of such changes can result in an undesirable change in the volume of fluid being dispensed by the dispenser. Therefore, there is also a need for a control system that can detect changes in dispensed amount and make automatic adjustments, so that the desired total amount of viscous material is uniformly dispensed over an entire dispensing cycle.

Current systems presume that the density of the viscous material remains constant. However, the density is constantly changing, resulting in an undesirable variance in the amount of fluid actually dispensed or jetted. It is desirable that the dispensed amount of viscous material has particular mass, volume, and density values, or has an acceptable tolerance of mass, volume, and density values. Having precise values of the density of the dispensed viscous material allows for greater precision in dispensing the desired amount of viscous material onto the substrate. Therefore, there is also a continuing need for precisely obtaining the density of the viscous material as the viscous material is being dispensed, and adjusting the dispensing parameters based on the density or specific gravity.

Generally, there is a need for an improved computer controlled viscous fluid dispensing system that addresses these and other challenges of accurately dispensing small amounts of viscous fluid in high productivity manufacturing processes and the like.

SUMMARY

The invention provides a method of controlling a non-contact jetting dispensing system to accurately dispense a viscous fluid onto a substrate in various manners. The method includes directing the viscous fluid from a viscous fluid supply into a non-contact jetting dispenser. The non-contact jetting dispenser has an inlet and an outlet. The method further includes discharging the viscous fluid from the outlet of the non-contact jetting dispenser. The non-contact jetting dispenser may be operable to start and stop the flow of the viscous fluid from the outlet onto the substrate. The method further includes using an electronic flow meter device, operatively coupled in a flow path between the viscous fluid supply and the outlet, to produce electrical flow meter output signals proportional to the flow rate of the viscous fluid flowing through the flow path. The electrical flow meter output signals form an output data set. The method may further include comparing the output data set to a reference data set stored in a control, and at least one performing a responsive control function in a closed loop manner by adjusting a dispensing parameter. This adjusting corrects for a difference between the output data set and the reference data set.

A viscous fluid dispensing system for accurately dispensing a viscous fluid onto a substrate is also disclosed. The system includes a viscous fluid dispenser including an inlet and an outlet. The system also includes a viscous fluid supply adapted to hold the viscous fluid and coupled in fluid communication with the inlet of the viscous fluid dispenser to establish a flow path for the viscous fluid between the viscous fluid supply and the outlet of the viscous fluid dispenser. The system also includes a gas flow meter device operatively coupled in the flow path to produce corresponding gas flow meter output signals corresponding to a first amount of the viscous fluid. The system also includes a weigh scale configured to receive and weigh the first amount and to produce corresponding weigh scale output signals. The system also includes a control operatively coupled to the gas flow meter and to the weigh scale, where the control determines a mass of the first amount using the weigh scale output signals received from the weigh scale, determines a volume of the first amount by integrating the gas flow meter output signals received from the gas flow meter device, and then determines a density of the first amount using the mass of the first amount and the volume of the first amount. Various additional or alternative aspects may be included in the system.

A method is also disclosed for controlling a viscous fluid dispensing system to accurately dispense a viscous fluid onto a substrate is also disclosed. The method includes directing a first amount of viscous fluid from a viscous fluid supply into a viscous fluid dispenser. The viscous fluid dispenser is operable to start and stop the flow of the viscous fluid through an outlet of the viscous fluid dispenser onto a substrate. The method also includes using a gas flow meter device operatively coupled in a flow path between the viscous fluid supply and the outlet to produce gas flow meter output signals proportional to the flow rate of the first amount flowing through the flow path. The method also includes discharging the first amount from the outlet onto a weigh scale coupled to the control. The weigh scale produces weigh scale output signals proportional to the mass of the first amount. The method also includes performing a responsive control function in a closed loop manner by adjusting at least one dispensing parameter using the gas flow meter output signals and the weigh scale output signals.

Additional aspects of the method will be understood from a review of the system operation discussed above and in more detail below. For example, in some embodiments, the output data set may include electrical flow meter output signals, or in other embodiments the output data set includes gas flow meter output signals and weigh scale output signals. Also the dispensing may involve various types of discrete volume outputs, such as dots, droplets or lines of the viscous fluid, or other types of outputs. These and other objects and advantages of the invention will become more readily apparent during the following detailed description taken in conjunction with the drawings herein.

DETAILED DESCRIPTION

Figure 1:
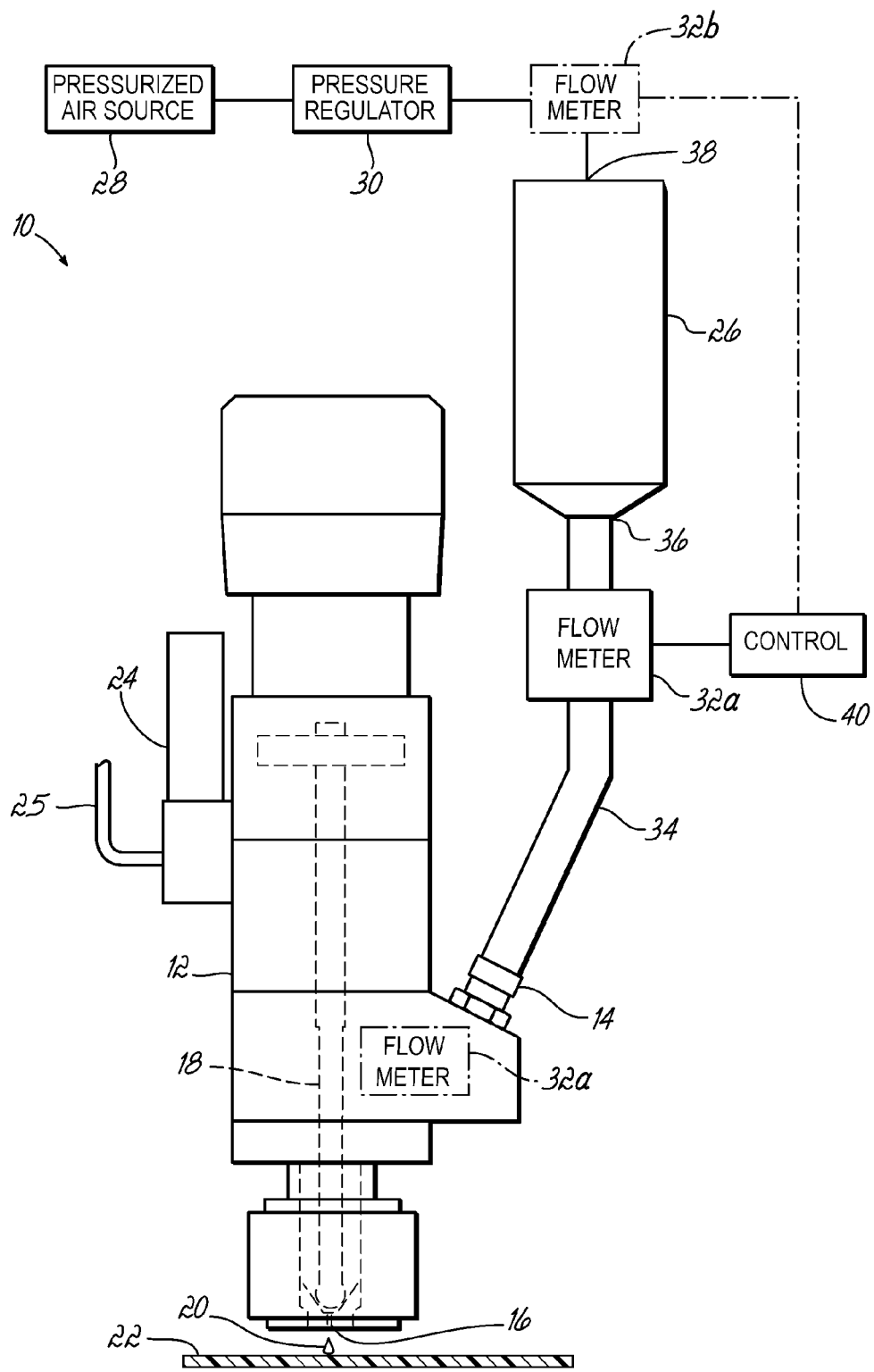
FIG. 1 is an elevational view of a viscous fluid dispensing system constructed according to an illustrative embodiment of the invention.

FIG. 1 is a schematic illustration of a viscous fluid dispensing system 10 for accurately dispensing viscous fluid and controlling a dispensing operation. The system 10 includes a viscous fluid dispenser 12 with a viscous fluid inlet 14, a dispensing outlet 16 for the viscous fluid and an internal, movable valve 18 for controlling an on/off dispensing operation of viscous fluid 20 onto a substrate 22. The valve 18 is movable between open and closed positions to dispense the viscous fluid 20 through the outlet 16 onto the substrate 22, for example, in discrete volumes. The invention is not limited to this type of method or structure for starting and stopping the flow from a dispenser. For example, other types of dispensers may be used that rely on pressure induced manners of starting and stopping flow. The dispenser 12 may be of any suitable type and configuration, depending on the dispensing application and needs of the user. In general, the dispenser may dispense continuous lines or other patterns of the viscous fluid 20 onto the substrate 22 or may be a jetting type dispenser that rapidly dispenses small, discrete volumes of the viscous fluid in the form of dots or droplets. For example, such jetting dispensers are available from Nordson ASYMTEK, Carlsbad, Calif., under the names DispenseJet® and NexJet™. The dispenser 12 may be operated, for example, pneumatically or electrically. As shown, the dispenser 12 includes, or is coupled with, a solenoid valve 24 that regulates the introduction of pressurized actuation air through a line or conduit 25 in a known manner to move the valve 18 at least to the open position.

In a dual air chamber dispenser, pressurized air would be also used to move the valve 18 to the closed position. In other embodiments, a spring may be used to move the valve 18 to the closed position.

The system 10 further includes a viscous fluid supply container 26 adapted to hold the viscous fluid 20, and coupled in fluid communication with the inlet 14 of the dispenser 12 to establish a flow path for the viscous fluid between the viscous fluid supply container 26 and the outlet 16 of the viscous fluid dispenser 12. In this embodiment, the supply of fluid 20 in the container 26 is pressurized with air from a suitable source 28 regulated by a pressure regulator 30. A liquid flow meter 32*a*, or flow rate sensor device, is coupled in the flow path to produce electrical flow meter output signals proportional to the flow rate of the fluid 20 flowing through the flow path when the valve 18 is in the open position. The liquid flow meter 32*a* may be coupled directly in a fluid line or conduit 34 extending from an outlet 36 of the supply container 26 to the inlet 14 of the dispenser 12. In this embodiment, the liquid flow meter 32*a* is preferably a Sensirion model LG 16-2000 or LG 16-1000 liquid flow sensor, or a model SLQ-QT105 flow sensor, available from Sensirion AG, Switzerland. The specific model of flow meter chosen will typically depend on the flow rates required for the application, and such factors as response time and sensitivity. In other embodiments, the liquid flow meter 32*a* may be incorporated directly in the dispenser 12, anywhere in the flow path upstream through the outlet 16, as shown in broken lines in FIG. 1. Another alternative, for example, would be locating the liquid flow meter 32*a* in the nozzle 16. In yet another embodiment, a gas flow meter 32*b* may be coupled to the pneumatic actuating side of the system. For example, the gas flow meter 32*b* may be coupled between the pressure regulator 30 and the inlet 38 of the container 26. In this embodiment, the gas flow meter 32*b* is preferably a Sensirion model SFM 3100 or SFM 4100 gas flow sensor, available from Sensirion AG, Switzerland. A control 40 is operatively coupled to the electronic flow meter, either 32*a* or 32*b*, regardless of its position in the system. The control 40 continuously receives and processes the electrical flow meter output signals indicative of either viscous fluid or gas flow rate data points, respectively, from the flow meter 32*a* or 32*b* and performs a responsive control function in a closed loop manner, as will be discussed further below. The control 40, for example, may be a PLC or programmable logic controller, or any other suitable computer-based control device capable of processing the signals from the liquid flow meter 32*a* or 32*b* and carrying out the functions to be discussed below. The applications for the system 10, as well as the fluid materials to be dispensed may be of any desired type, including those discussed in the background above.

Figure 2:
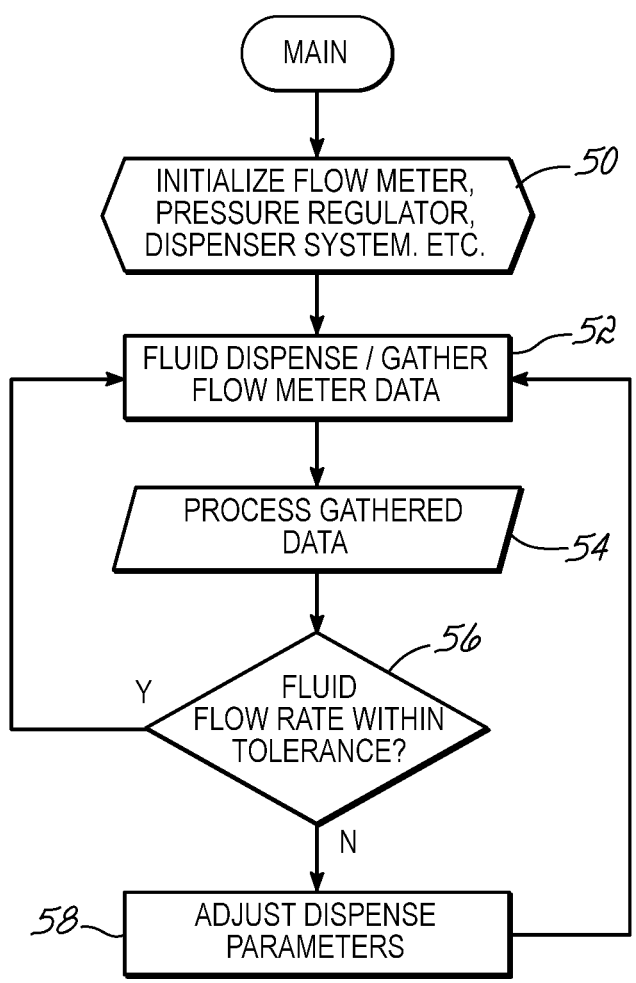
FIG. 2 is a flow diagram illustrating an embodiment of the steps performed by a control associated with the system shown in FIG. 1.
Figure 3:
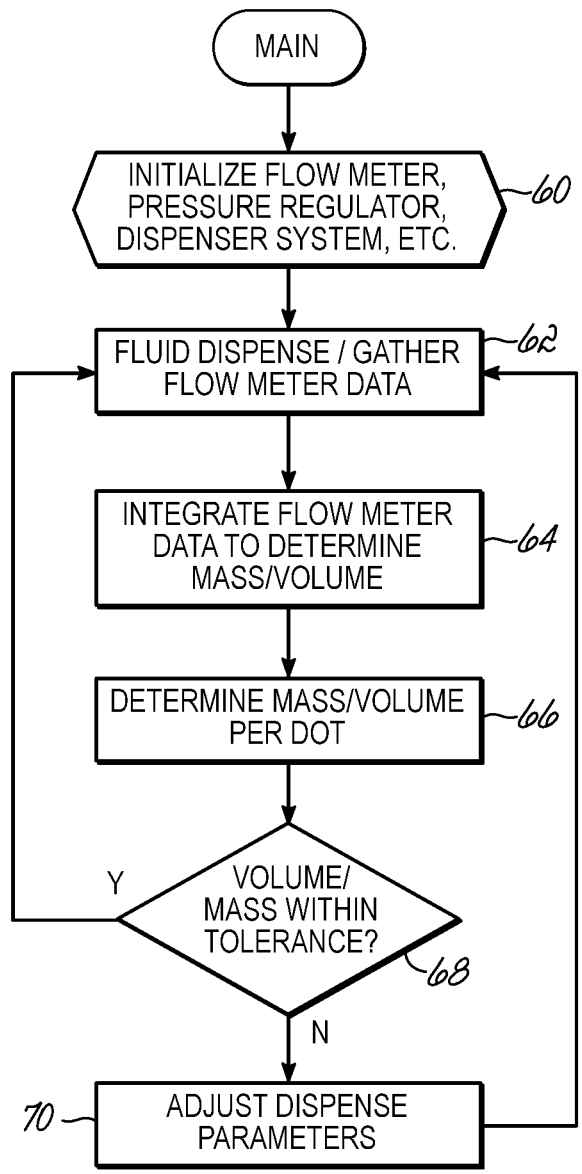
FIG. 3 is a flow diagram illustrating another embodiment of the steps performed by a control associated with the system shown in FIG. 1.

FIGS. 2 and 3 illustrate different embodiments of general flow diagrams of the software to be implemented and carried out by the control 40 shown in FIG. 1. As shown in a first step 50 of FIG. 2, the flow meter 32*a* or 32*b*, pressure regulator 30, and any other control components associated with the dispenser 12, are initialized to start a dispensing operation. In the next step 52, the dispenser 12 begins dispensing the viscous fluid in the desired manner, as programmed and carried out by the control 40, for example, to rapidly dispense multiple dots or droplets, or a line of the fluid 20 onto the substrate 22 (FIG. 1). While the dispensing operation is being carried out, viscous fluid or gas flow data points (signals) are collected by the control 40 from the flow meter 32*a* or 32*b*. This data is processed in step 54, in one or more manners, to be discussed further below. For example, the processing in step 54 can involve a comparison of the gathered data set to a stored reference data set or other analysis. At step 56, the control 40 determines whether the flow rate of the viscous fluid is within tolerance. If the flow rate is within tolerance, the process returns to step 52 and continues the dispensing operation. If the flow rate is not within tolerance, the dispense parameters are adjusted accordingly at step 58. The control 40 then continues to carry out the dispensing operation and the control functions in a closed loop manner.

In order to analyze the data or signals gathered from the flow meter 32*a* or 32*b*, the control 40 may, for example, compare the output data from the flow meter 32*a* or 32*b* to stored reference data. The output data from the flow meter 32*a* or 32*b*, for example, may be a data set. The data set may be plotted graphically as flow rate vs. time. As a result, a curve or wave form may be generated by the control 40. A generally square wave may be created, in which the signal peaks while the dispenser valve 18 is open and then rapidly falls off when the valve is closed. During a jetting operation, the wave or curve generated by the flow signal data output from the flow meter 32*a* or 32*b* will resemble a sawtooth pattern along the curve indicating the rapid on and off or open and closed conditions of the valve 18 as the fluid material 20 is rapidly jetted as dots from the dispenser outlet 16. When the valve 18 is maintained in a closed position at the end of the jetting operation, the wave form or curve will fall to zero. In this operation, the analysis performed by the control 40 may compare the wave form generated by data (signals) from the flow meter 32*a* or 32*b* to a reference wave form which represents a more ideal flow pattern. If the two wave forms or curves being compared are dissimilar, the control 40 makes adjustments to the system 10. More generally, the control 40 compares a current or real time data set which is based on signals from the flow meter 32*a* or 32*b*, and representative of viscous fluid or gas flow, and compares that real time data set to an analogous reference data set of viscous fluid or gas flow. Based on detecting discrepancies between the two data sets that are being compared, the control is programmed to then make adjustments to various process parameters of the system 10. It is not necessary that the data set actually be assembled as a wave form by the control 40. In the case of a continuous dispense operation having a dispense cycle in which the valve 18 is continuously open to dispense, for example, a line of viscous fluid 20, the wave form may be even more square-shaped.

The analysis performed upon gathering the signals/data from the flow meter 32*a* or 32*b* may involve various processes and/or algorithms. One process may involve comparing the average of the peaks in the detected wave form with a reference or ideal wave form stored in the control 40. Another method can involve determining the area underneath the wave form (i.e., integrate under the curve) and comparing that area with reference data.

In the case of dispensing lines of fluid 20 or jetting dots of fluid 20, a data set representing proper flow during the dispensing, or jetting, can be stored as a reference data set, and then compared to the real time data set from the flow meter 32*a* or 32*b*. If the real time data set varies from the reference data set, then corrections can be made to dispensing, or jetting. Alterations to the system may include, for example, changing the air pressure to the syringe or container 26 that supplies the fluid 20, adjusting the time when the dispenser is dispensing viscous fluid 20, the temperature of the dispenser 12, rate of dispensing the viscous fluid 20 (the firing rate), or the number of dots dispensed in a particular pattern. Corrections can be made very quickly, such as within a response time of 40 milliseconds. For example, there is typically on the order of 100 milliseconds between two consecutive dispenses and this time may be used to adjust or correct the amount of viscous fluid 20 dispensed without affecting process time. Consequently, corrections can be made between the end of one dispense or jetting operation and the beginning of the next dispense or jetting operation. This very short response time compares to several minutes which may be required to dispense fluid material 20 on a weigh scale, weigh the fluid material 20, calculate flow, etc. as per prior calibration procedures.

The system 10 can also be used to detect one or more air bubbles that discharge through the outlet 16. In this case, the flow meter 32a or 32b will detect a momentary increase in the flow rate as the air bubble passes through the dispenser outlet 16. This momentary increase in the flow rate, if detected by the control 40 based on signals from the flow meter 32a or 32b, may be used to indicate the problem to the operator, such as through an alarm, signal light, or other indicator on a control or computer screen. The operator may then inspect the substrates 22 for any quality issues and perform any necessary maintenance of the system 10. The system 10 may also be used to detect a clogged or semi-clogged condition associated with the dispenser 12 and, most likely, associated with the nozzle or outlet 16 of the dispenser 12. In this case, the flow meter 32a or 32b will detect either no flow or significantly reduced flow. If this condition is detected, the signals from the flow meter 32a or 32b may be used by the control 40 to indicate the condition to the operator, such as by use of an alarm sound, light or other indicator such as on a computer or control screen. This will allow the operator to shut the system down for maintenance purposes. Quick shut down of the system 10 due to a problem such as air bubbles or clogged conditions will minimize product waste and increase yield.

As shown in the first step 60 of FIG. 3, the flow meter 32a or 32b, pressure regulator 30 and any other control components associated with the dispenser 12 are initialized to start a dispensing operation. In the next step 62, the dispenser 12 begins dispensing the viscous fluid 20 in the desired manner, as programmed and carried out by the control 40, for example, to rapidly dispense multiple dots or droplets, or a line of the fluid 20 onto the substrate 22. As previously discussed, while the dispensing operation is being carried out, viscous fluid or gas flow data points are collected by the control 40 from the flow meter 32a or 32b. These signals may include electronic flow meter device signals. This data may be processed in step 64, in one or more manners, to be discussed further below. For example, the processing in step 64 may involve integrating the viscous fluid or gas flow meter data to determine the volume of an amount of viscous fluid 20 passing through the flow meter 32a or 32b. In other words, integrating the flow meter data with respect to time produces the volume of a first amount of viscous fluid 20. The volume of the output data set may then be compared against a reference volume of the reference data set. If desired, the mass of the first amount of viscous fluid 20 may be determined using reference data, where the mass corresponds to a particular volume of a viscous fluid 20 flowing through the flow meter 32a or 32b. These reference values may be stored in the control 40. In step 66, the volume (in the form of data or signals), or the combined mass and volume (in the form of signals or data), may be determined on a per dot basis by dividing the total mass or total volume by the total number of dots. In step 68, the control 40 may determine whether the value (for example, a volume/mass value) is within an acceptable tolerance. If the value is within the acceptable tolerance, the viscous fluid is dispensed and the dispensing process proceeds. Alternatively, if the value is not within the acceptable tolerance, one or more dispensing parameters may be adjusted. Further, the user may be warned, as discussed in more detail below.

Adjusting the dispensing parameters may include, for example, adjusting the flow rate of the viscous fluid 20 flowing through and being dispensed through the outlet 16 of the dispenser 12, adjusting the dispensing time to be either shorter or longer, adjusting the frequency at which viscous fluid is dispensed through the outlet onto the substrate by increasing the number of dispensing operations over a given period of time, adjusting the number of discrete dots or droplets using multiple doses of viscous fluid 20, and adjusting the speed of the relative motion between the dispenser 12 and the substrate. Each of these dispensing parameters may be adjusted singularly or in combination with the other dispensing parameters to correct for the difference between the output data set and the reference data set. Adjusting the flow rate flowing through and being dispensed through the outlet 16 of the dispenser 12 may include, for example, adjusting the viscosity of the fluid 20 by adjusting the temperature of the viscous fluid 20. The temperature of the viscous fluid 20 may be adjusted using a heater (not shown). The heater may be configured to increase and decrease the temperature of the viscous fluid 20 being dispensed by dispenser 12. Further, the heater may be electrically coupled with the control 40, with the control 40 being configured to manipulate the heater. However, other methods of adjusting the flow rate of fluid 20 being dispensed from outlet 16 are also envisioned.

Adjusting the speed of the relative motion between the dispenser 12 and the substrate may be performed in the following manner. The system 10 may permit the relative speed between the nozzle 48 and the substrate 22 to be automatically optimized as a function of the viscous fluid dispensing characteristics and a specified total volume of material to be used on the substrate 22. In addition, the system 10 may optimize the positions at which respective dots are to be dispensed as a function of the relative speed between the outlet 16 of the dispenser 12 and the substrate 22. Specifically, comparing the output data set to a reference data set may include using the output data set to determine a speed of relative motion between the dispenser 12 and the substrate 22 which results in a target amount of viscous fluid 20 being discharged onto the substrate 22.

The speed of relative motion may be determined by first determining the amount of viscous fluid 20 in the form of a total number of dots required to substantially equal the target amount is determined. This may be determined by computing an average per dot volume of the output data set. Additionally, the distance between each of the total number of dots required to distribute the dots or droplets is determined. Additionally, a rate at which the total number of dots or droplets are to be dispensed from the dispenser 12 is determined. This is the rate at which the total number of dots or droplets are to be dispensed and the distance between each of the dots in the total number of dots or droplets. This rate may then be utilized to adjust the speed of the relative motion between the dispenser 12 and the substrate 22 to discharge a target amount of viscous fluid 20 onto the substrate 22. Further details are shown and described by the Applicant in application Ser. No. 13/079,300, entitled "Viscous Material Non-Contact Jetting System", now issued as U.S. Pat. No. 8,257,779, the disclosure of which is hereby incorporated by reference.

Figure 4:
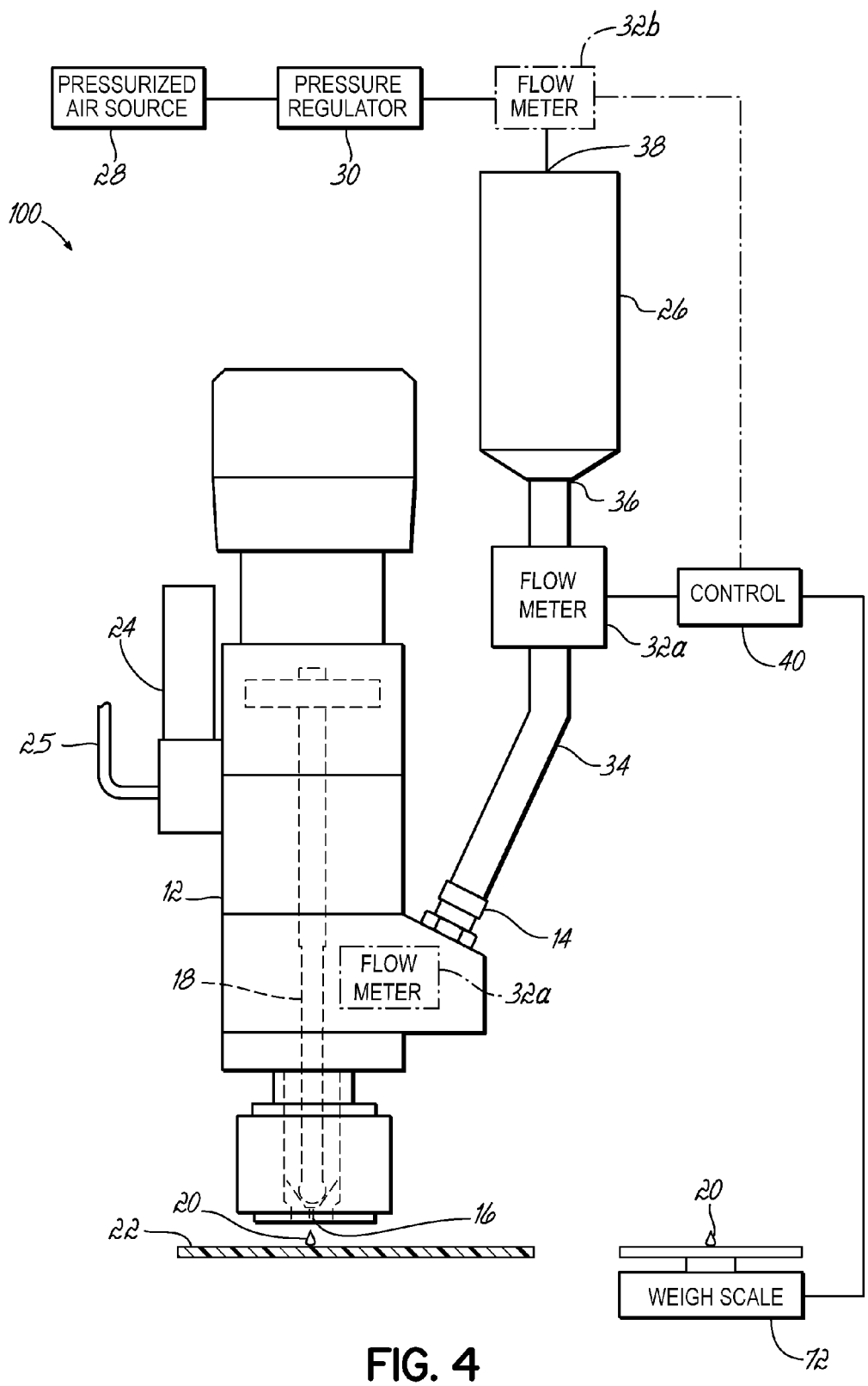
FIG. 4 is an elevational view of a viscous fluid dispensing system constructed according to another illustrative embodiment of the invention.

FIG. 4 is a schematic illustration of a viscous fluid dispensing system 100 for accurately dispensing viscous fluid 20 and controlling a dispensing operation. The system 100 of FIG. 4 is similar to the system 10 of FIG. 1, but additionally includes a weigh scale 72 electrically coupled to the control 40. The weigh scale 72 may include a calibration surface 73 for receiving viscous fluid 20. The weigh scale 72 is configured to receive and weigh an amount of the viscous fluid 20 deposited on the calibration surface 73 and to produce weigh scale output signals proportional to the mass of the amount of viscous fluid 20. The weigh scale 72 enables small amounts of viscous fluids 20 in various forms such as dots or droplets, or lines to be accurately weighed. The viscous fluid 20 may be deposited or jetted depending on the desired application. In addition to the control 40 being operatively coupled to the weigh scale 72, the control 40 is also operatively coupled to either a liquid flow meter 32a or a gas flow meter 32b. As will be discussed in further detail below, using a weigh scale 72 and a gas flow meter 32b provides different benefits than using a weigh scale 72 and a liquid flow meter 32a.

Using both a weigh scale 72 and a gas flow meter 32b allow for the density of the viscous fluid 20 to be determined, which solves the problems associated with only using either a weigh scale 72 or a gas flow meter 32b coupled to the control 40. For example, using only a weigh scale 72 allows the mass to be determined, however, to obtain the mass from the weigh scale 72, the dispensing operation stops. This decreases the throughput of the viscous fluid dispenser 12, which of course is undesirable. As used herein, "mass" is intended to include any measurement of mass including, for example, mass, mass flow rate, and weight as discussed below. Mass flow rate is a measure of the mass of the viscous fluid 20 flowing through the outlet 16 of the dispenser 12 for a given time unit, and is customarily measured in pounds per second or kilograms per second. Weight is related to mass using the formula W=m×g, where weight (W) equals mass (m) multiplied by gravitational acceleration (g). Alternatively, since the temperature and pressure of the gas flowing through the gas flow meter 32b are known, this allows for the volume of the gas to be determined. As one skilled in the art would appreciate, this allows the volume of the viscous fluid 20 to be determined. As used herein, "volume" is intended to include any measurement of volume including, for example, volume and volume flow rate (also known as volumetric flow rate). Volume flow rate is a measure of the volume of the viscous fluid 20 flowing through the outlet 16 of the dispenser 12 for a given time unit. However, volume does not provide information regarding the mass of the viscous fluid 20.

As a result, using the weigh scale 72 as a "setup tool" along with a gas flow meter 32b prior to commencing full-scale dispensing allows the density and specific gravity to be determined for an amount of viscous fluid 20. Specifically, the gas flow meter 32b produces gas flow meter output signals proportional to the flow rate of a second amount of the viscous fluid flowing through the flow path and dispensed through the outlet 36. This allows the control 40 to use the density of the first amount and the volume of the second amount to estimate the mass of the second amount. This allows for more accurate dispensing of the viscous fluid 20. Using the historic data regarding the first and second amounts allows the system 10 to adjust dispensing parameters in real time.

Figure 5:
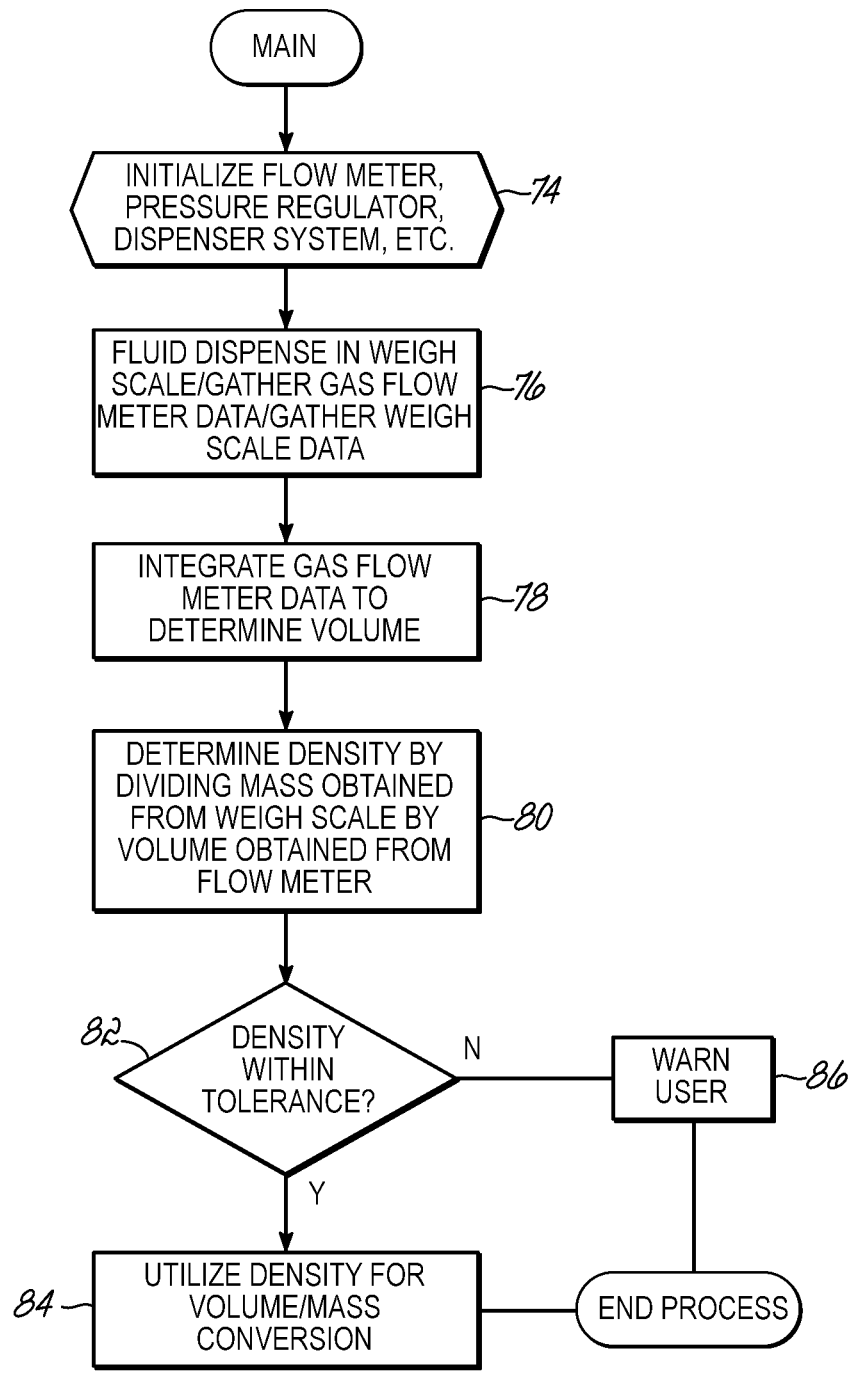
FIG. 5 is a flow diagram illustrating an embodiment of the steps performed by a control associated with the system shown in FIG. 4.

FIG. 5 illustrates a general flow diagram of the software to be implemented and carried out by the control 40. FIG. 5 may utilize both a weigh scale 72 and a gas flow meter 32b to obtain the density or specific gravity of the dispensed fluid. In the first step 74, the gas flow meter 32b, pressure regulator 30 and any other control components associated with the dispenser 12 are initialized to start a dispensing operation. In the next step 76, dispenser 12 begins dispensing the viscous fluid 20 in the desired manner. This includes a first amount of the viscous fluid 20 being dispensed into weigh scale 72, gathering the gas flow meter output data and gathering the weigh scale output data. As a result, the mass of the first amount may be determined using the weigh scale output signals. Likewise, the volume of the first amount may be determined, potentially simultaneously, using the gas flow meter output signals. This data may be processed in step 78, in one or more manners, to be discussed further below. For example, the processing in step 78 may involve integrating the gas flow meter data to determine the volume of a first amount of viscous fluid 20 passing through the gas flow meter 32b. Integrating the viscous fluid or gas flow meter data with respect to time produces the volume of a first amount of viscous fluid 20.

In the next step 80, the density (equaling mass divided by volume) may be determined by generally dividing the mass obtained using the weigh scale 72 by the volume obtained using the gas flow meter 32b. Specific gravity may also be determined using density. Specific gravity is the ratio of the density of the viscous fluid 20 (as discussed above) to the density of a reference substance, generally water, at a particular temperature. If desired, the mass and volume of the first amount of viscous fluid 20 may be determined on a per dot, per droplet, or per line basis. In other words, the density may be determined using multiple dots or droplets, or lines of viscous fluid 20, or alternatively, the density may be determined using a single dot, a single droplet, or a single line of viscous fluid 20. At step 82, the control 40 determines whether the density of the viscous fluid 20 is within an acceptable tolerance of predetermined values. If the density is within the acceptable tolerance, the process may utilize a conversion factor (such as inverse density equaling volume/mass) to ensure greater operational precision. The acceptable tolerance may be determined using a reference data set stored in the control 40 or by other acceptable methods. If the density is not within an acceptable tolerance, the user is warned. For example, the control 40 may provide a suitable indication to an operator, such as an alarm sound or light indicator, or an indication on a screen or monitor associated with the control. In addition to or in place of an indication to an operator, at least one dispensing parameter may be adjusted as previously discussed. While density is shown and described in relation to FIG. 5, specific gravity may also be determined and adjusted as desired.

After the control 40 receives and processes the gas flow meter output signals and the weigh scale output signals to determine a density of the first amount, the control 40 may use the density of the first amount and the volume of the second amount to determine an estimated mass of the second amount. Having an estimated mass of the second amount, the control 40 can adjust one or more dispensing parameters, as discussed above, for further amounts of the viscous fluid dispensed through the outlet. As a result, the viscous fluid dispensing system 10 can continually use the density and volume of previous amounts to estimate the mass and continually improve the dispensing operation. This allows all volume measurements to be taken using the gas flow meter, while obtaining the density from the gas flow meter 32b and the weigh scale 72 to compute the mass without stopping production and to make adjustments to the process.

In another illustrative embodiment of system 100, the control may be operatively coupled to both the weigh scale 72 and the liquid flow meter 32a. In this embodiment, using both a weigh scale 72 and a liquid flow meter 32a allows for the liquid flow meter 32a to be quickly and precisely calibrated. While the weigh scale 72 is first quickly and precisely calibrated by placing an object of a known weight on the calibration surface 73 of the weigh scale 72, the process to calibrate a liquid flow meter 32a is much more difficult. However, dispensing an amount of viscous fluid 20 through the liquid flow meter 32a and onto the calibration surface 73 of the weigh scale 72, allows for a quick and precise calibration of the liquid flow meter 32a. As a result, incorporating both a weigh scale 72 and a liquid flow meter 32a effectively allows for weigh scale 72 to calibrate the liquid flow meter 32a.

It will be appreciated that the system 10, 100 may be used for on-the-fly adjustments to the dispense parameters and on-the-fly detection purposes as discussed above, while a manufacturing process involving the dispense operation is underway. That is, the routine depicted in FIGS. 2, 3, and 5 may be in continuous use during the manufacturing process such that dispense parameters are adjusted during manufacturing to increase productivity. The routine of FIG. 5 includes determining density prior to full-scale dispensing as discussed above. The systems 10, 100 may also be used with a calibration station in which the dispenser 12 is taken off-line to a calibration station and the routine shown in FIGS. 2, 3, and 5 is performed at the calibration station as opposed to being performed on-the-fly during the manufacturing process. Even this use of the systems 10, 100 at a calibration station have advantages. For example, less fluid material 20 will be used than in typical calibration stations using weigh scales and the calibration and adjustment process will be faster and potentially more accurate. Certain fluid materials, such as flux, are volatile and the solvents associated with these fluids will evaporate when exposed at atmosphere. Thus, if a weigh scale process takes enough time to allow evaporation, the results will be less accurate. With the system 10 of this invention, the flow data is collected by the control 40 in an amount of time that approaches real time. Evaporation of solvents associated with the fluid is not a factor in this metrology. Also envisioned as off-line is where dispenser 12, still coupled to the system 10, 100, dispenses viscous fluid 20 onto a calibration surface 73 of a weigh scale 72 located adjacent or otherwise near the substrate.

While the present invention has been illustrated by a description of several embodiments, and while such embodiments have been described in considerable detail, there is no intention to restrict, or in any way limit, the scope of the appended claims to such detail. Additional advantages and modifications will readily appear to those skilled in the art. Therefore, the invention in its broadest aspects is not limited to the specific details shown and described. The various features disclosed herein may be used in any combination necessary or desired for a particular application. Consequently, departures may be made from the details described herein without departing from the spirit and scope of the claims which follow.

What is claimed is:

1. A viscous fluid dispensing system for accurately dispensing a viscous fluid onto a substrate, the system comprising:
   a viscous fluid dispenser including an inlet and an outlet;
   a viscous fluid supply adapted to hold the viscous fluid and coupled in fluid communication with the inlet of the viscous fluid dispenser to establish a flow path for the viscous fluid between the viscous fluid supply and the outlet of the viscous fluid dispenser;
   a gas flow meter device operatively coupled to the viscous fluid supply to produce corresponding gas flow meter output signals corresponding to a first amount of the viscous fluid;
   a weigh scale configured to receive and weigh the first amount and to produce corresponding weigh scale output signals; and
   a controller operatively coupled to the gas flow meter device and to the weigh scale, wherein the controller determines a mass of the first amount using the weigh scale output signals received from the weigh scale, determines a volume of the first amount by integrating the gas flow meter output signals received from the gas flow meter device, and then determines a density of the first amount using the mass of the first amount and the volume of the first amount.

2. The system of claim 1, wherein the controller compares the density of the first amount to a predetermined tolerance and causes a warning a user if the density is outside of the predetermined tolerance.

3. The system of claim 1, wherein:
   the gas flow meter device further produces gas flow meter output signals proportional to a volume of a second amount of the viscous fluid flowing through the flow path and dispensed through the outlet, and
   the controller uses the density of the first amount and the volume of the second amount to determine a mass flow rate of the second amount.

4. The system of claim 3, wherein the controller is further configured to adjust at least one dispensing parameter to adjust the mass flow rate of the second amount.

5. The system of claim 4, wherein the controller is configured to adjust the at least one dispensing parameter by adjusting a fluid supply pressure of the viscous fluid supply.

6. The system of claim 4, wherein the controller is configured to adjust the at least one dispensing parameter by adjusting the frequency at which successive amounts of the viscous fluid are dispensed through the outlet.

7. The system of claim 4, further comprising a temperature controller coupled to the controller, wherein the controller is configured to adjust the at least one dispensing parameter by using the temperature controller to adjust the temperature of the viscous fluid dispenser.

8. The system of claim 4, wherein the viscous fluid dispenser is a jetting dispenser configured to jet dots of viscous fluid, and wherein the controller is configured to adjust the at least one dispensing parameter by adjusting a firing rate that the dots are jetted from the jetting dispenser.

9. The system of claim 4, wherein the viscous fluid dispenser is a jetting dispenser configured to jet dots of viscous fluid, and wherein the controller is configured to adjust the at least one dispensing parameter by adjusting a number of dots jetted in a pattern.

10. The system of claim 3, wherein the controller further detects an air bubble in the viscous fluid flowing through the viscous fluid dispenser.

11. The system of claim 1, wherein:
   the viscous fluid supply further comprises a pressurized supply using pressurized air flowing through a pneumatic input of the viscous fluid supply, and
   the gas flow meter device is operatively coupled to the pneumatic input to produce corresponding gas flow meter output signals corresponding to the flow rate of the pressurized air flowing through the pneumatic input.

12. The system of claim 11, wherein the controller is further configured to adjust at least one dispensing parameter by adjusting the pressure of the pressurized supply.

* * * * *